United States Patent
Nishimoto

(10) Patent No.: US 8,242,405 B2
(45) Date of Patent: Aug. 14, 2012

(54) MICROWAVE PLASMA PROCESSING APPARATUS AND METHOD FOR PRODUCING COOLING JACKET

(75) Inventor: Shinya Nishimoto, Amagasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/054,014

(22) PCT Filed: Jun. 24, 2009

(86) PCT No.: PCT/JP2009/061477
§ 371 (c)(1),
(2), (4) Date: Jan. 13, 2011

(87) PCT Pub. No.: WO2010/007863
PCT Pub. Date: Jan. 21, 2010

(65) Prior Publication Data
US 2011/0121058 A1    May 26, 2011

(30) Foreign Application Priority Data
Jul. 15, 2008   (JP) .................................. 2008-183972

(51) Int. Cl.
*B23K 10/00*   (2006.01)
(52) U.S. Cl. ........... 219/121.43; 219/121.4; 219/121.52; 118/723 MW
(58) Field of Classification Search ............... 219/121.4, 219/121.41, 121.43, 121.52, 121.59; 118/723 R, 118/723 I; 204/298.37, 298.38; 315/111.51, 315/111.21
See application file for complete search history.

(56) References Cited

U.S. PATENT DOCUMENTS

| 6,321,681 | B1 * | 11/2001 | Colpo et al. ................. 118/723 I |
| 8,076,252 | B2 * | 12/2011 | Takatsuki ...................... 438/799 |
| 2008/0006371 | A1 | 1/2008 | Muraoka et al. |

FOREIGN PATENT DOCUMENTS

| JP | 09-063793 | 3/1997 |
| JP | 11-111827 | 4/1999 |
| JP | 2002-075881 | 3/2002 |
| JP | 2002-095267 | 3/2002 |
| JP | 2007-335346 | 12/2007 |
| JP | 2008-013816 | 1/2008 |
| JP | 2008-071845 | 3/2008 |

OTHER PUBLICATIONS

International Search Report—PCT/JP2009/061477 dated Aug. 18, 2009.

* cited by examiner

*Primary Examiner* — Mark Paschall
(74) *Attorney, Agent, or Firm* — Cantor Colburn LLP

(57) ABSTRACT

A microwave plasma processing apparatus has a microwave antenna in which a wavelength-shortening plate and a cooling portion of a cooling jacket are arranged adjacent to each other.

8 Claims, 6 Drawing Sheets

MICROWAVE PLASMA PROCESSING APPARATUS AND METHOD FOR PRODUCING COOLING JACKET

TECHNICAL FIELD

The present invention relates to a microwave plasma processing apparatus that is very suitably used to manufacture a micro semiconductor device or to manufacture a high-resolution flat panel display apparatus including a liquid crystal display apparatus, and a method for producing a cooling jacket used in the microwave plasma processing apparatus.

BACKGROUND ART

A plasma processing process and a plasma processing apparatus are indispensible technologies in manufacturing a recent micro semiconductor device having a gate length is near to, or equal to or below 0.1 µm, which is so-called a deep sub micron device or a deep sub quarter-micron device, or manufacturing a high-resolution flat panel display apparatus including a liquid crystal display apparatus.

The plasma processing apparatus used to manufacture a semiconductor device or a liquid crystal display apparatus uses any one of various conventional methods of exciting plasma, but specifically, a parallel plate type high-frequency excitation plasma processing apparatus or an inductively coupled plasma processing apparatus is generally used as the plasma processing apparatus.

However, since plasma formation is not uniform and a region having high electron density is limited in such conventional plasma processing apparatuses, it is difficult to perform a uniform process on the entire surface of a substrate to be processed at a high processing speed, i.e., high throughput. Such a difficulty becomes serious when a substrate having a large diameter is processed. Moreover, since an electron temperature is high in the conventional plasma processing apparatuses, there are several fundamental problems, such as generation of damage to a semiconductor device formed on a substrate to be processed, large metal contamination due to sputtering on a wall of a processing chamber, etc. Thus, it is difficult for the conventional plasma processing apparatuses to satisfy strict requirements for further miniaturizing and further improving productivity of a semiconductor device or a liquid crystal display apparatus.

Considering such problems, a microwave plasma processing apparatus using high-density plasma excited by a microwave electric field, not by a direct current magnetic field, has been suggested. For example, a plasma processing apparatus, which is configured to radiate a microwave from an antenna (radial line slot antenna) having a plurality of slots arranged to generate a uniform microwave and having a flat shape into a processing container, and excite plasma by ionizing a gas in a vacuum container according to the microwave electric field, has been suggested (for example, refer to Japanese Laid-Open Patent Publication No. hei 9-63793).

The microwave plasma excited via such a method may realize high plasma density throughout a wide region directly below the antenna, and thus it is possible to perform a is uniform plasma process in a short time. Moreover, the microwave plasma formed as such a method has a low electron temperature since plasma is excited by a microwave, and thus damage of a substrate to be processed or metal contamination may be avoided. Also, since uniform plasma can be easily excited even on a large substrate, the plasma processing apparatus can easily cope with a manufacturing process of a semiconductor device using a semiconductor substrate having a large diameter or a manufacturing process of a large liquid crystal display apparatus.

FIG. 1 is a cross-sectional view showing an example of a structure of a conventional microwave plasma processing apparatus.

A microwave plasma processing apparatus 10 shown in FIG. 1 includes a processing container 11 having a support 111 that supports a substrate to be processed S in the processing container 11, and a gas shower 12 and a gas introduction pipe 17 disposed in the processing container 11. The gas introduction pipe 17 is formed to penetrate through an inner wall 11B of the processing chamber 11 while being held by the inner wall 11B, thereby mainly supplying an inert gas for plasma generation into the processing container 11. The gas shower 12 is fixed to an inner wall of the processing container 11 by a jig that is not shown, and is configured to supply a gas for processing from a gas supply source that is also not shown into the processing container 11 through an opening 12A. Also, an opening 11A for connection to an exhaust system, such as a vacuum pump or the like, that is not shown is formed at the bottom of the processing container 11.

Also, a microwave antenna 13 is provided on the processing container 11 to vacuum-seal the processing container 11. A coaxial waveguide 14 extending perpendicularly upward is provided at about a center of the microwave antenna 13, and a coaxial converter 15 is provided at an end portion of the coaxial waveguide 14, which is of a side opposite to the microwave antenna 13.

The coaxial waveguide 14 includes an inner conductor 141 and an outer conductor 142, wherein an upper end portion 141A of the inner conductor 141 and an upper wall surface of the coaxial converter 15 are fixed by a screw 21, and an upper end portion 142A of the outer conductor 142 and a lower wall surface of the coaxial converter 15 are fixed by a screw 22. Accordingly, the coaxial waveguide 14 and the coaxial converter 15 are mechanically and electrically connected to each other.

The microwave antenna 13 includes a cooling jacket 131, a wavelength-shortening plate 132 provided to face the cooling jacket 131, and a slot plate 133 provided on a main surface, of the wavelength-shortening plate 132, which is of a side opposite to the other main surface of a side on which the cooling jacket 131 is provided.

Also, the cooling jacket 131, the wavelength-shortening plate 132, and the slot plate 133 are provided on a top plate 135 that is a constituent of the antenna 13. The top plate 135 is supported by an upper end portion of the wall surface 11B of the processing container 11. Also, although not specifically shown, the cooling jacket 131 is mechanically fixed to the upper end portion of the wall surface 11B by a screw or the like.

A lower end portion 142B of the outer conductor 142 of the coaxial waveguide 14 is fixed to the cooling jacket 131 by a screw 23. Accordingly, the coaxial waveguide 14 and the antenna 13 are mechanically and electrically connected to each other.

Also, the cooling jacket 131 is provided to cool down a top plate (microwave transmission window) or the like that is heated up by radiant heat or the like of plasma generated in the processing container 11, wherein a refrigerant flows inside a communicating hole 131A formed inside the cooling jacket 131. Also, a portion including the communicating hole 131A forms a cooling portion 131B.

Also, a lid 134 is coupled to a top surface of the cooling jacket 131 by a screw 24 by disposing an O-ring 28 on the top surface of the cooling jacket 131, and thus the communicating hole 131A is blocked by the lid 134.

Also, as shown in FIG. 1, an end portion 133A of the slot plate 133 is fixed to the cooling jacket 131 by a screw 26.

When treatment processing or the like of the substrate to be processed S installed on the support 111 is started by generating the plasma in the processing container 11, the antenna 13, specifically the top plate 135 is heated up to or above 100° C. by the radiant heat of the plasma. Accordingly, as described above, the antenna 13 needs to be cooled is down by the cooling jacket 131.

However, with respect to the cooling of the top plate 135 that is mostly affected by the radiant heat of the plasma, the cooling portion 131 B of the cooling jacket 131 and the top plate 135 are spaced apart from each other, and the wavelength-shortening plate 132 and the slot plate 133 are disposed between the cooling portion 131B and the top plate 135. Accordingly, original thermal resistance increases since the cooling portion 131B and the top plate 135 are spaced apart from each other, and at the same time, a gap may be generated between the wavelength-shortening plate 132 or the like and the cooling jacket 131 due to deformation of the wavelength-shortening plate 132 or the like and the cooling jacket 131 by the above-described radiant heat. Thus, the thermal resistance also increases due to such formation of the gap. As a result, it was difficult to sufficiently effectively and efficiently cool down the top plate 135 by using the cooling jacket 131. Prior Art Document (Patent Document 1) Japanese Laid-Open Patent Publication No. hei 9-63793

DISCLOSURE OF THE INVENTION

Technical Problem

An objective of the present invention is to effectively and efficiently perform cooling on a microwave antenna included in a microwave plasma processing apparatus, specifically, on a top plate adjacent to a processing container.

Technical Solution

According to an aspect of the present invention, there is provided a microwave plasma processing apparatus including: a processing container having therein a support for supporting a substrate to be processed; an exhaust system connected to the processing container; a microwave transmission window provided on the processing container to face the substrate to be processed on the support; a gas supply unit supplying a plasma generating gas to the processing container; and a microwave antenna provided on the processing container, wherein the microwave antenna includes a cooling is jacket including a cooling portion having a communicating hole for flowing a refrigerant, a wavelength-shortening plate provided to face the cooling jacket, and a slot plate formed on a main surface, of the wavelength-shortening plate, which is of a side opposite to the other main surface of a side on which the cooling jacket is provided, and the wavelength-shortening plate and the cooling portion of the cooling jacket are disposed adjacent to each other.

According to the present invention, in the cooling jacket forming the microwave antenna, the cooling portion that actually performs a cooling function by flowing the refrigerant is directly adjacent to the wavelength-shortening plate. Accordingly, a spaced distance between the cooling portion and the wavelength-shortening plate is reduced, while a gap is prevented from being formed between the cooling jacket and the wavelength-shortening plate. As a result, thermal resistance between the cooling portion and the wavelength-shortening plate is reduced, and thus the top plate on which the wavelength-shortening plate is disposed may be effectively and efficiently cooled down by the cooling portion.

Also, not only cooling efficiency of the wavelength-shortening plate but also cooling efficiency of the slot plate is increased since the cooling portion and the wavelength-shortening plate are disposed adjacent to each other, and thus thermal deformation of the wavelength-shortening plate and the slot plate due to radiant heat of plasma generated in the processing container may be prevented. Accordingly, a gap may be prevented from being formed between the cooling jacket and the wavelength-shortening plate or the like. Thus, thermal resistance resulted from the gap may be suppressed from being increased, and consequently, the top plate may be more effectively cooled down by the cooling portion of the cooling jacket.

Also, "the cooling portion and the wavelength-shortening plate are disposed adjacent to each other" is a concept allowing a metal film, such as a plating film or the like, to be disposed on the cooling portion, as long as the spaced distance between the cooling portion and the wavelength-shortening plate is reduced as described above and also the gap is prevented from being formed between the cooling jacket and the is wavelength-shortening plate. In other words, the metal film such as the plating film or the like may exist between the cooling portion and the wavelength-shortening plate as long as the above-described effects are produced. Also, because such a metal film exists, thermal conductivity between the cooling portion and the wavelength-shortening plate increases, and thus the above-described effects may be improved.

Also, according to an embodiment of the present invention, the cooling jacket and the wavelength-shortening plate may be bonded by using, for example, a conductive material. Here, since an adjacent state of the cooling jacket and the wavelength-shortening plate may be fixed, a gap may be prevented from being formed, specifically between the cooling jacket and the wavelength-shortening plate.

According to an embodiment of the present invention, a coefficient of linear expansion of a jacket composition material of the cooling jacket may be substantially identical to a coefficient of linear expansion of a composition material of the wavelength-shortening plate. Accordingly, thermal expansion of the cooling jacket due to the radiant heat may be the same as thermal expansion of the wavelength-shortening plate, and thus even in a case such as when the cooling jacket and the wavelength-shortening plate are thermally deformed due to the radiant heat, degrees of deformation of the cooling jacket and the wavelength-shortening plate may be the same. Accordingly, bonding between the cooling jacket and the wavelength-shortening plate is satisfactorily maintained, thereby increasing cooling efficiency of the top plate by the cooling portion.

Also, the terms "substantially identical" means that a difference between the coefficient of linear expansion of the cooling jacket and the coefficient of linear expansion of the wavelength-shortening plate is within a range of about 10%.

Also, according to the embodiment, the jacket composition material may be Al—SiC, and the composition material may be alumina. Of course, other materials may be used as long as the condition regarding the terms "substantially identical" is satisfied. However, since Al—SiC has thermal conductivity equal to metal aluminum, thermal resistance of the cooling jacket itself may be reduced, and thus the top plate may be is effectively cooled down by the cooling jacket.

Also, according to an embodiment of the present invention, the microwave antenna may include a board formed on a main surface, of the cooling jacket, which is of a side opposite to the wavelength-shortening plate. Accordingly, thermal deformation of the cooling jacket may be effectively suppressed.

Also, by forming the board with, for example, alumina or the like, a surface of the cooling jacket may be maintained at a stable temperature, and thus a temperature in a surface of the cooling jacket may be uniform.

Also, the cooling jacket may be formed by bonding a cooling portion body having a communicating hole for flowing a refrigerant, and a lid sealing the communicating hole, by using a conductive material, such as a brazing material. Also, the cooling jacket may be formed of MMC, wherein Al is impregnated in a SiC matrix.

Advantageous Effects

As described above, according to the present invention, cooling can be effectively and efficiently performed on a microwave antenna included in a microwave plasma processing apparatus, specifically, on a top plate adjacent to a processing container.

BEST MODE FOR CARRYING OUT THE INVENTION

Hereinafter, exemplary embodiments of the present invention will be described in detail with reference to attached drawings.

Figure 1:
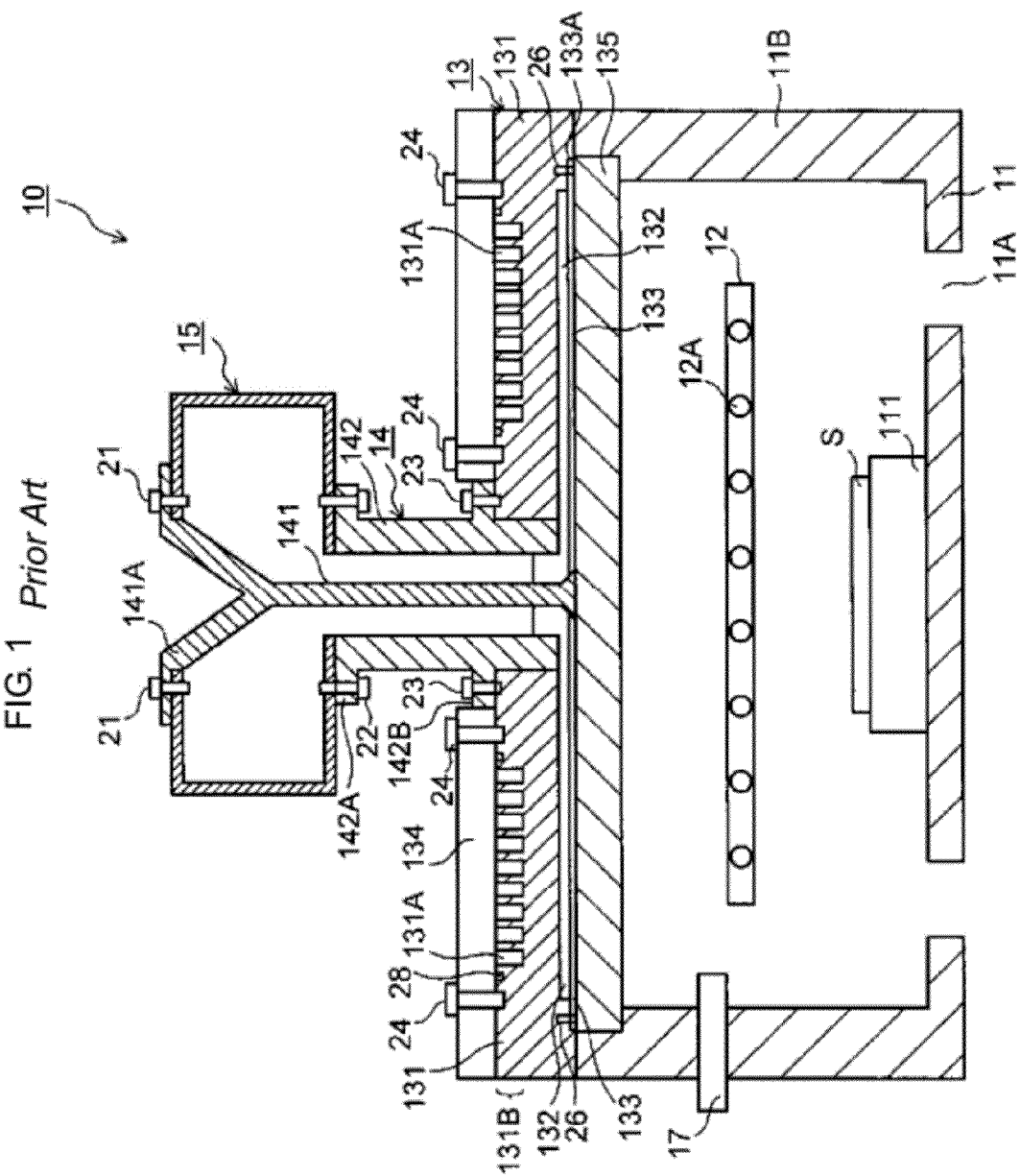
FIG. 1 is a cross-sectional view showing an example of a structure of a conventional microwave plasma processing apparatus.
Figure 2:
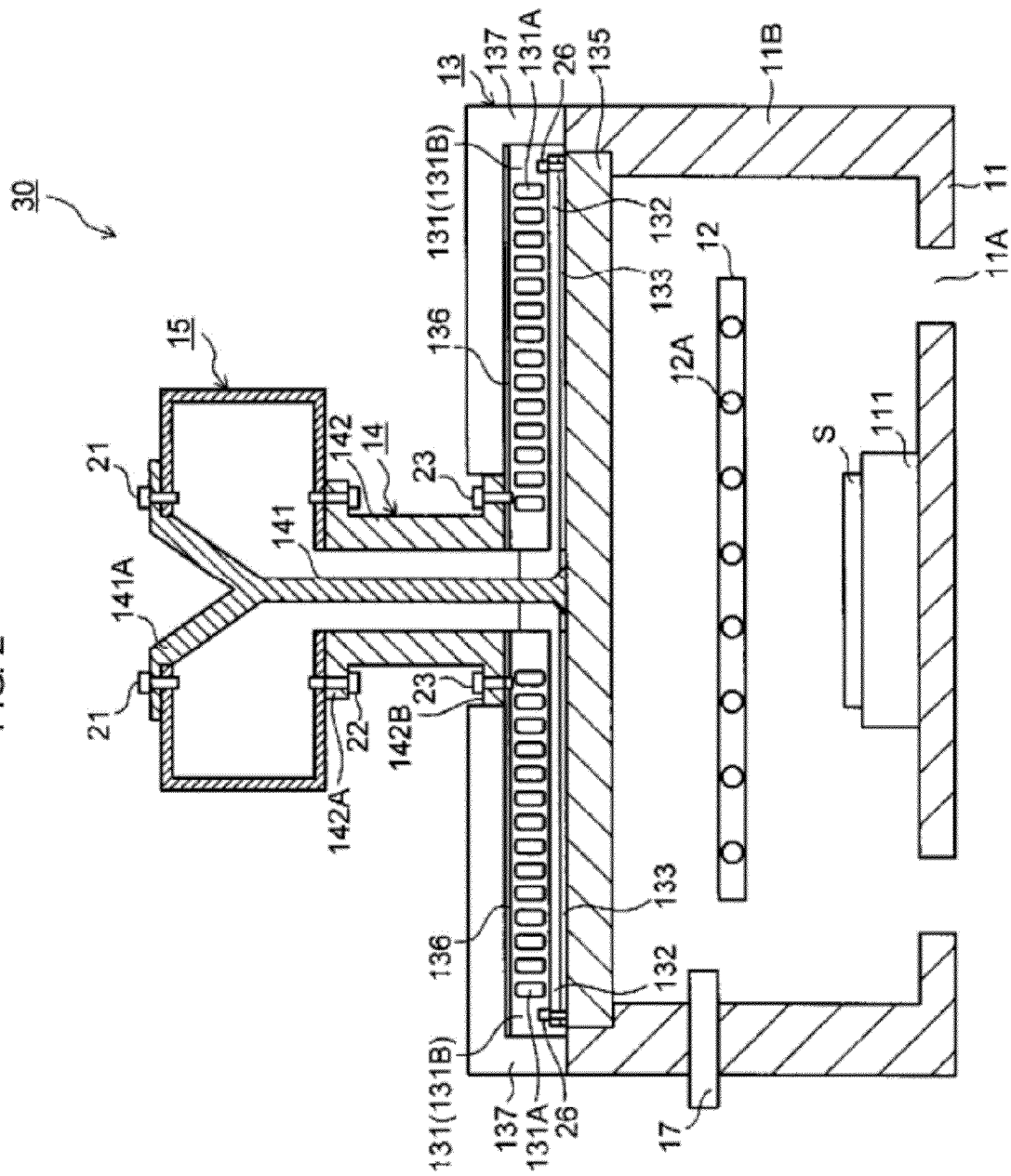
FIG. 2 is a cross-sectional view showing an example of a structure of a microwave plasma processing apparatus of the present invention.
Figure 3:
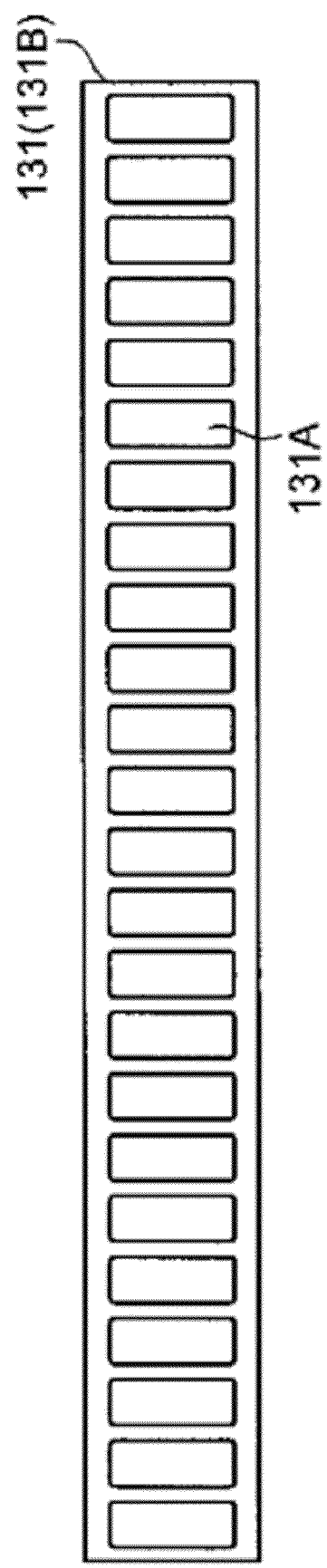
FIG. 3 is a magnified structural view of a cooling jacket of the microwave plasma processing apparatus shown in FIG. 2.

FIG. 2 is a cross-sectional view showing an example of a structure of a microwave plasma processing apparatus of the present invention, and FIG. 3 is a magnified view of a structure of a cooling jacket of the microwave plasma processing apparatus shown in FIG. 2. Also, a plane shape of the microwave plasma processing apparatus, specifically a microwave antenna portion thereof, is generally a circle, and although not specifically shown, a plane shape of each constituent of the apparatus shown below is also a circle. Also, the same reference numerals are used for constituents that are same or similar to the constituents shown in FIG. 1.

A microwave plasma processing apparatus 30 shown in FIG. 2 includes a processing container 11 having a support 111 supporting a substrate to be processed S in the processing container 11, and a gas shower 12 and a gas introduction pipe 17 disposed inside the processing container 11. The support 111 may be a susceptor mainly formed of alumina, SiC, or the like. Here, the substrate to be processed S is absorbed and fixed to a main surface of the susceptor by static electric power generated from an electrode formed inside the susceptor. Also, if required, a heater for heating the substrate to be processed S may be built inside the susceptor.

The gas introduction pipe 17 is formed to penetrate through an inner wall 11B of the processing container 11, while being held by the inner wall 11B, thereby mainly supplying an inert gas for plasma generation into the processing container 11. The gas shower 12 is fixed to an inner wall of the processing container 11 by a jig that is not shown, and is configured to supply a gas for processing from a gas supply source that is also not shown into the processing container 11 through an opening 12A. The gas can be uniformly supplied near the substrate to be processed S since a plurality of openings 12A are is formed in a length direction of the gas shower 12 at predetermined intervals. Thus, a microwave plasma process may be uniformly performed on the substrate to be processed S.

Also, an opening 11A for connection to an exhaust system that is not shown, such as a vacuum pump or the like, is formed at the bottom of the processing container 11. A vacuum level (pressure) in the processing container 11 is held at a suitable value via exhaust generated by using the vacuum pump or the like through the opening 11A.

An inert gas such as Ar or the like is mainly introduced into the processing container 11 from the gas introduction pipe 17, and an etching gas such as a fluorine-based gas is mainly introduced into the processing container 11 from the gas shower 12. Also, such an etching gas may be used alone, but generally used after being diluted by an inert gas or the like.

Also, a microwave antenna 13 is provided on the processing container 11 to vacuum-seal the processing container 11. The microwave antenna 13 includes a cooling jacket 131 formed of, for example, Al—SiC or the like, a wavelength-shortening plate 132 formed to face the cooling jacket 131 and formed of a dielectric material, for example, alumina or the like, and a slot plate 133 formed on a main surface, of the wavelength-shortening plate 132, which is of a side opposite to the other main surface of a side on which the cooling jacket 131 is formed, and formed of a good electrical conductor, for example Cu or the like.

Also, a board 136 formed of, for example alumina, is provided on the main surface of the cooling jacket 131, which is of the side opposite to the wavelength-shortening plate 132. Thermal deformation of the cooling jacket 131 may be effectively suppressed according to existence of the board 136.

Since the board 136 is formed of alumina or the like, a surface of the cooling jacket 131 may maintain a safe temperature, and thus a temperature in a surface of the cooling jacket 131 may also be uniform.

The cooling jacket 131, the wavelength-shortening plate 132, and the slot plate 133 are provided on a top plate 135 which is a constituent of the antenna 13, and are fixed by is a fixing member 137 formed of a conductive material, such as Al. The top plate 135 is supported by an upper end portion of the side wall 11B of the processing container 11. Also, although not specifically shown, the fixing member 137 is mechanically fixed to the side wall 11B by a screw or the like.

Also, a wavelength-shortening plate and a slot plate may be integrally formed. In this case, a gap is not generated between a bottom surface of the wavelength-shortening plate and the slot plate, and thus cooling efficiency may be further improved.

Also, the cooling jacket 131 is provided to cool down the antenna 13, specifically the top plate 135, and provided mainly to suppress the antenna 13, specifically the top plate 135, from being heated up by radiant heat of plasma generated inside the processing container 11. A plurality of communicating holes 131A are formed inside the cooling jacket 131, and a refrigerant flows in the communicating holes 131A.

A coaxial waveguide 14 extending perpendicularly upward is provided at about a center of the microwave antenna 13, and a coaxial converter 15 is provided at an end portion of the coaxial waveguide 14, which is of a side opposite to the microwave antenna 13.

The coaxial waveguide 14 includes an inner conductor 141 and an outer conductor 142, wherein an upper end portion 141A of the inner conductor 141 and an upper wall surface of the coaxial converter 15 are fixed by a screw 21, and an upper end portion 142A of the outer conductor 142 and a lower wall surface of the coaxial converter 15 are fixed by a screw 22. Accordingly, the coaxial waveguide 14 and the coaxial converter 15 are mechanically and electrically connected to each other.

Also, the inside of the inner conductor 141 may be hollow and the inner conductor 141 may be cooled down by flowing the refrigerant in the hollow.

Also, the cooling jacket 131 may be fixed to the top plate 135 by a screw 26. Also, the outer conductor 142 of the coaxial waveguide 14 is electrically connected to the cooling jacket 131, and accordingly, the coaxial waveguide 14 and the cooling jacket 131 are electrically connected to each other.

A microwave in a TM mode and a microwave in a TE mode are mixed together by is introducing a microwave supplied from a microwave supply source that is not shown to the coaxial converter 15, and such a mixed wave is guided by the coaxial waveguide 14 and supplied to the microwave antenna 13. Here, the microwave in the TM mode propagates inside a cavity 143 formed by the inner conductor 141 and the outer conductor 143, and then propagates inside the wavelength-shortening plate 132. Then, the microwave wave in the TM mode is emitted from an emission hole, which is not shown, of the slot plate 133, penetrated through the top plate 135, and supplied into the processing container 11.

A gas supplied from the gas shower 12 into the processing container 11 is plasmatized, and the plasmatized gas is used to perform processing or the like of the substrate to be processed S.

As described above, when the processing or the like of the substrate to be processed S is performed by generating plasma by supplying the microwave into the processing container 11, the microwave antenna 13, specifically the top plate 135 is heated up by the radiant heat of the plasma. A microwave antenna needs to be cooled down since thermal deformation may be generated when the microwave antenna is heated up. According to the present embodiment, in order to effectively perform cooling, a cooling portion 131B of the cooling jacket 131, which performs a cooling function, is adjacently disposed to the wavelength-shortening plate 132, thereby bonding the cooling jacket 131 and the wavelength-shortening plate 132.

Accordingly, a spaced distance between the cooling portion 131B (the cooling jacket 131) and the wavelength-shortening plate 132, i.e., the top plate 135, is reduced. As a result, thermal resistance between the cooling portion 131B (the cooling jacket 131) and the top plate 135 is reduced, and thus the top plate 135 may be effectively and efficiently cooled down by the cooling portion 131B.

Also, since not only cooling efficiency of the wavelength-shortening plate 132 but also cooling efficiency of the slot plate 133 is increased by disposing the cooling portion 131B (the cooling jacket 131) directly adjacent to the wavelength-shortening plate 132, thermal deformation of the wavelength-shortening plate 132 and slot plate 133 due to the radiant heat of the plasma generated inside the processing container 11 may also be prevented. Accordingly, a pore may be prevented from being formed between the cooling portion 131B (the cooling jacket 131) and the wavelength-shortening plate 132 or the like. Thus, thermal resistance resulted from the pore may be suppressed from being increased, and consequently, the top plate 135 may be effectively cooled down by the cooling portion 131B (the cooling jacket 131).

Here, the cooling portion 131B and the wavelength-shortening plate 132 do not have to be bonded to each other, but at least needs to be adjacent to each other. In this case, a metal film such as a plating film or the like may be disposed between the cooling portion 131B and the wavelength-shortening plate 132. The thermal conductivity between the cooling portion and the wavelength-shortening plate may be increased according to the existence of the metal film, and thus above-descried effects may be improved.

Comparing the conventional microwave plasma processing apparatus 10 shown in FIG. 1 with the microwave plasma processing apparatus 30 according to the present embodiment shown in FIG. 2, a size (thickness) of the cooling jacket 131 may be reduced since the cooling jacket 131 is directly formed of the cooling portion 131B in the present embodiment. Accordingly, a size (thickness) of the microwave antenna 13 may also be reduced.

Also, according to the present embodiment, the cooling jacket 131 is formed of Al—SiC, and the wavelength-shortening plate 132 is formed of alumina. Here, a coefficient of linear expansion of the cooling jacket 131 is about $8.0\times10^{-6}/°$ C., and a coefficient of linear expansion of the wavelength-shortening plate 132 is about $7.0\times10^{-6}/°$ C. Accordingly, thermal expansion coefficients of the cooling jacket 131 and the wavelength-shortening plate 132 are very similar, and substantially the same. Thus, even in a case such as when the cooling jacket 131 and the wavelength-shortening plate 132 are thermally deformed due to the radiant heat, degrees of deformation of the cooling jacket 131 and the wavelength-shortening plate 132 may be the same.

As a result, adhesiveness between the cooling jacket 131 (the cooling portion 131B) and the wavelength-shortening plate 132 may be sufficiently highly held, and thus is formation of a pore resulted from the thermal deformation is suppressed, thereby preventing the thermal resistance from being increased. Accordingly, the top plate 135 may be effectively cooled down by the cooling jacket 131, i.e., the cooling portion 131B.

Also, as described above, since the phrase that the coefficient of linear expansion of the cooling jacket 131 and the coefficient of linear expansion of the wavelength-shortening plate 132 are substantially identical means that a difference between the coefficients of linear expansion is within a range of about 10%, a material forming the cooling jacket 131 is not limited to Al—SiC and a material forming the wavelength-shortening plate 132 is not limited to alumina, as long as such a requirement is satisfied. For example, the wavelength-shortening plate 132 may be formed of yttria instead of alumina.

However, since Al—SiC has the equal thermal conductivity as metal aluminum, thermal resistance of the cooling jacket 131 itself may be reduced according to the present embodiment. Thus, the top plate 135 may be effectively cooled down by the cooling jacket 131 (the cooling portion 131B).

Also, Al—SiC may be manufactured by using any method, but is generally manufactured by preparing a SiC sintered body and impregnating melted Al in pores of the sintered body. Here, Al—SiC employs a structure of MMC (Metal Matrix Composite), wherein particles of SiC are dispersed in an Al matrix. Accordingly, in order to assign a coefficient of linear expansion sufficient to be used to Al—SiC, the content of Al may be in the range from about 30 volume % to about 50 volume %. Also, the concentration of aluminum may be high on a bonding surface, considering bonding intensity.

Next, a bonding example when an MMC formed of Al—SiC is used in the cooling jacket 131 will be described.

Figure 4:
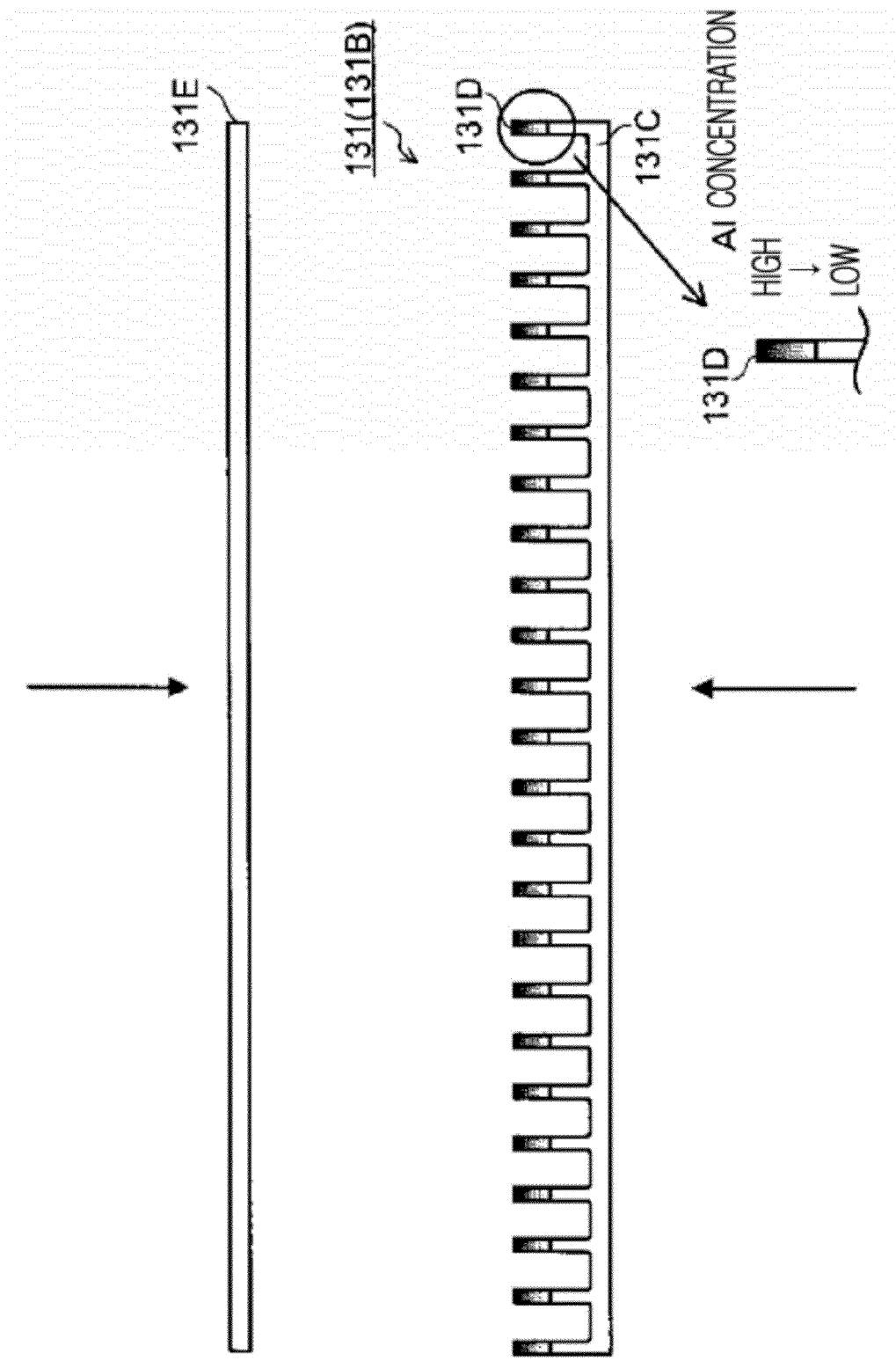
FIG. 4 is a view showing an example of a method for producing the cooling jacket shown in FIG. 3.

As shown in FIG. 4, a cooling portion body 131C having a communicating hole 131A for flowing a refrigerant, and a lid 131E for sealing the communicating hole 131A are separately prepared. Then, a bonding material 131D is formed on a bonding surface of the cooling portion body 131C.

The bonding material 131D may be formed via a separate coating process, but may is be formed by exposing part of a composition material of the cooling portion body 131C on the bonding surface of the cooling portion body 131C. Here, rapid concentration change in a bonding portion is prevented by controlling a particle size of a basic material in such a way that concentration of a bonding material (for example, Al) steps up toward a bonding part, thereby increasing intensity of the bonding part. In detail, the basic material (SiC) having a large particle size is controlled to be increased, and concentration of the basic material (SiC) having a small diameter is controlled to be decreased, thereby impregnating Al in the material.

In the present embodiment, the cooling jacket 131 is formed of Al—SiC. When Al is impregnated in a SiC matrix, an Al layer remains on a basic material SiC. Al may be used as a bonding material without having to remove the Al layer.

Also, when the Al layer is used as a bonding material, the lid 131E to be bonded may be equally formed of Al. Here, since the bonding material 131D and the lid 131E includes the same material, i.e., Al, bonding intensity according to thermal diffusion shown below is increased.

Next, the cooling portion body 131C and the lid 131E are pressed in a direction indicated by an arrow while being heated. Accordingly, a composition element of the bonding material 131D and a composition element of the lid 131E are bonded together via thermal diffusion, and as a result, the communicating hole 131A of the cooling portion body 131C is blocked by the lid 131E, thereby completing the cooling jacket 131.

In the above description, the bonding intensity is increased by changing the percentage of Al. Alternatively, the bonding intensity may be increased by increasing a surface area of the bonding surface by performing a blast process on the bonding surface.

Figure 5:
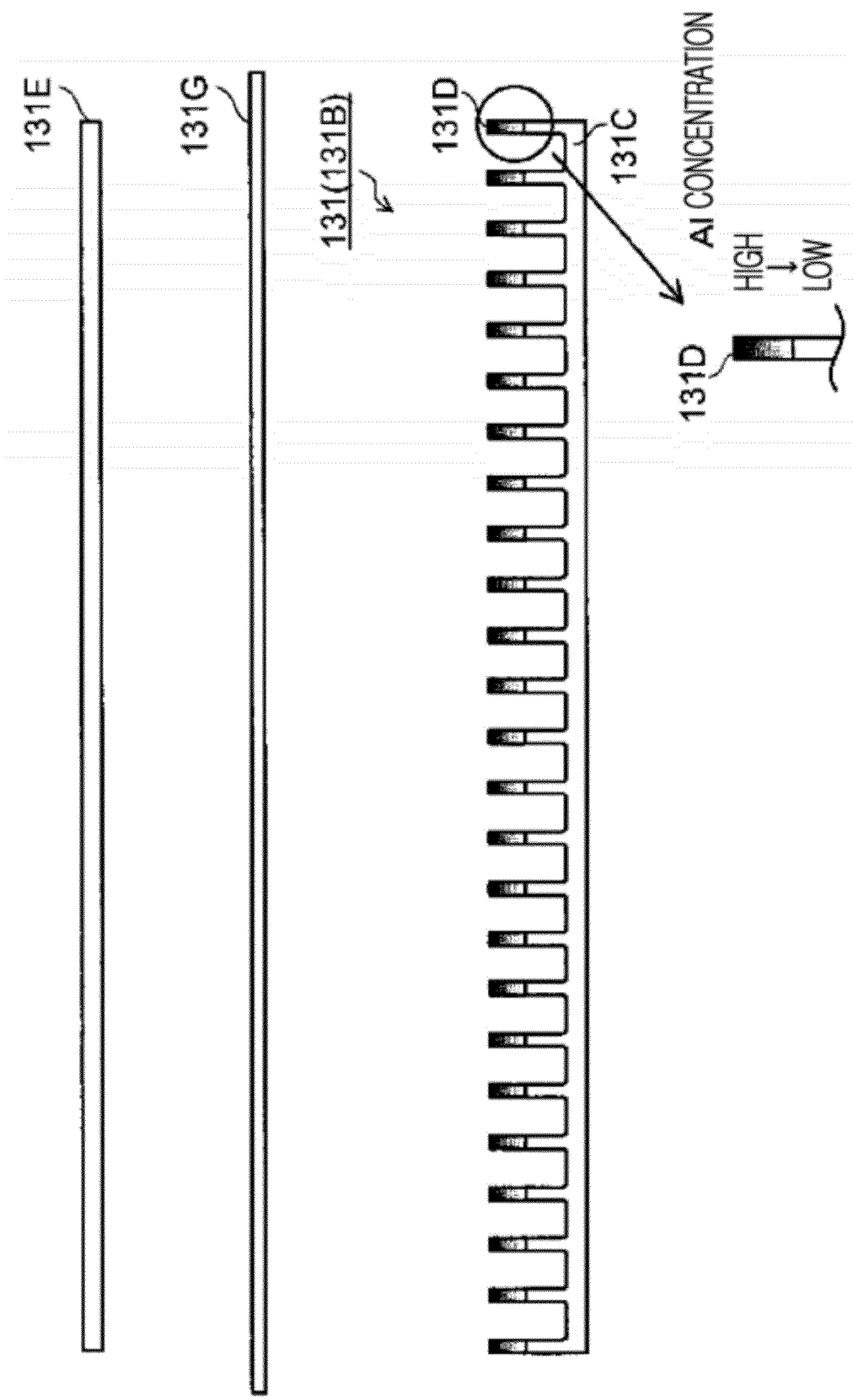
FIG. 5 is, equally, a view showing an example of a method for producing the cooling jacket shown in FIG. 3.

FIG. 5 is a modified example of the method shown in FIG. 4. In the present embodiment, a brazing material 131G having a sheet shape is disposed between the cooling portion body 131C and the lid 131E. Here, since the above-described thermal diffusion bonding is performed with the brazing material 131G interposed between the cooling portion body 131C and the lid 131E, the bonding intensity between the bonding material 131D, i.e., the cooling portion body 131C, and the lid 131E may be improved.

Figure 6:
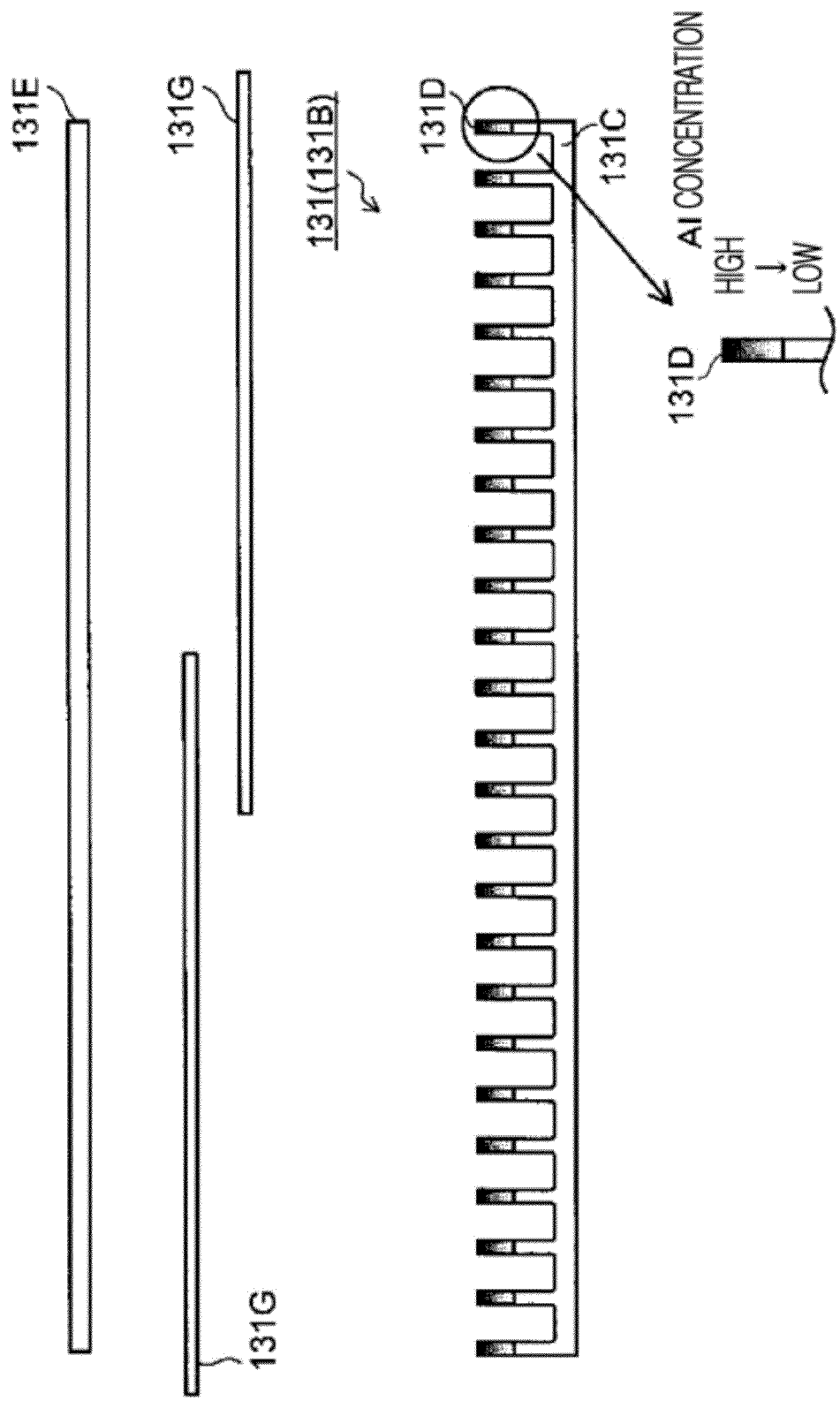
FIG. 6 is, equally, a view showing an example of a method for producing the cooling jacket shown in FIG. 3.

Also, as shown in FIG. 6, a plurality of brazing materials 131G may be used when, for example, sizes (areas) of the cooling portion body 131C and the lid 131E are relatively large. Here, end portions of the plurality of brazing materials 131G may overlap with each other so that an effect of the brazing materials 131G in the bonding portion is noticeable.

The cooling jacket 131 may be simply and efficiently produced by using any one of the methods of FIGS. 4 through 6. However, the method for producing the cooling jacket 131 is not limited to the above methods. For example, a bonding surface of the cooling portion body 131C and a bonding surface of the lid 131E may be directly bonded without having to dispose the first bonding material 131D.

Also, the bonding of the cooling portion body 131C and the lid 131E does not have to be based on thermal diffusion bonding, and any other method may be used. However, according to the thermal diffusion bonding, the bonding intensity between the cooling portion body 131C and the lid 131E is improved, and also sealability of the communicating hole 131A is increased, and thus a problem such as leakage of the refrigerant outside the cooling jacket 131 is prevented from occurring.

While this invention has been particularly shown and described with reference to exemplary embodiments thereof, it will be understood by those skilled in the art that various changes in form and details may be made therein without departing from the spirit and scope of the invention as defined by the appended claims.

The invention claimed is:

1. A microwave plasma processing apparatus comprising:
a processing container having therein a support for supporting a substrate to be processed;
an exhaust system connected to the processing container;
a microwave transmission window provided on the processing container so as to face the substrate to be processed on the support;
a gas supply unit supplying a plasma generating gas to the processing container; and
a microwave antenna provided on the processing container, wherein the microwave antenna comprises a cooling jacket comprising a cooling portion body having a communicating hole for flowing a refrigerant and a lid, a wavelength-shortening plate in contact with the cooling portion body of the cooling jacket, and a slot plate in contact with the wavelength-shortening plate at opposite side of the cooling jacket, and
the cooling portion body is formed of a material having a thermal expansion coefficient substantially identical to that of a material forming the wavelength-shortening plate.

2. The microwave plasma processing apparatus of claim 1, wherein the cooling jacket and the wavelength-shortening plate are bonded to each other.

3. The microwave plasma processing apparatus of claim 1, wherein the material of the cooling portion body is an Al—SiC composite material, and the material of the wavelength-shortening plate is alumina.

4. The microwave plasma processing apparatus of claim 1, wherein the microwave antenna comprises a board disposed on top of the lid of the cooling jacket, which is of the side opposite to the wavelength-shortening plate.

5. The microwave plasma processing apparatus of claim 4, wherein the board is formed of alumina.

6. The microwave plasma processing apparatus of claim 3, wherein the Al—SiC composite material comprises an sintered SiC and aluminum penetrated into pores of the sintered SiC.

7. The microwave plasma processing apparatus of claim 6, wherein the cooling body portion is bonded with the lid and has a higher aluminum concentration at the bonding surface than the remaining portion.

8. The microwave plasma processing apparatus of claim 6, wherein a brazing material is disposed between the cooling body portion and the lid.

* * * * *